(12) United States Patent
Toyoda

(10) Patent No.: US 6,667,530 B2
(45) Date of Patent: Dec. 23, 2003

(54) SEMICONDUCTOR DEVICE AND MANUFACTURING METHOD THEREOF

(75) Inventor: Yoshihiko Toyoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 09/895,070

(22) Filed: Jul. 2, 2001

(65) Prior Publication Data

US 2002/0137328 A1 Sep. 26, 2002

(30) Foreign Application Priority Data

Jan. 17, 2001 (JP) ........................................ 2001-008723

(51) Int. Cl.[7] .............................................. H01L 29/00
(52) U.S. Cl. ........................ 257/499; 257/758; 257/772; 257/396; 257/397; 257/751; 257/752; 253/762; 253/763
(58) Field of Search .................. 438/631, 633, 438/678, 601, 622, 642, 639; 257/499, 758, 772, 396, 397, 621, 637, 774, 751, 752, 762, 763

(56) References Cited

U.S. PATENT DOCUMENTS

| 5,635,423 | A | | 6/1997 | Huang et al. | |
|---|---|---|---|---|---|
| 5,677,243 | A | | 10/1997 | Ohsaki | |
| 5,891,513 | A | | 4/1999 | Dubin et al. | |
| 6,028,362 | A | * | 2/2000 | Omura | ........................ 257/774 |
| 6,191,031 | B1 | * | 2/2001 | Taguchi et al. | ............... 438/642 |
| 6,221,780 | B1 | * | 4/2001 | Greco et al. | ................. 438/702 |
| 6,251,774 | B1 | * | 6/2001 | Harada et al. | ............... 438/637 |
| 6,294,315 | B2 | * | 9/2001 | Shin et al. | ................... 430/313 |
| 6,319,815 | B1 | * | 11/2001 | Iguchi et al. | ............... 438/624 |
| 6,323,125 | B1 | * | 11/2001 | Soo et al. | ................... 438/645 |
| 6,326,301 | B1 | * | 12/2001 | Venkatesan et al. | ........ 438/638 |
| 6,333,519 | B1 | * | 12/2001 | Nakazawa | ..................... 257/72 |
| 6,372,647 | B1 | * | 4/2002 | Lu et al. | ...................... 438/689 |
| 6,376,048 | B1 | * | 4/2002 | Takeishi | ...................... 428/209 |
| 6,420,791 | B1 | * | 7/2002 | Huang et al. | ............... 257/797 |
| 6,465,157 | B1 | * | 10/2002 | Li et al. | ...................... 430/313 |

FOREIGN PATENT DOCUMENTS

| JP | 2000-294642 | | 10/2000 | | |
|---|---|---|---|---|---|
| JP | 02002093904 | A | * | 3/2002 | ......... H01L/21/768 |

OTHER PUBLICATIONS

Richard et al., "Roles Of Additives During Filling Process of Damascene Structures With Electrochemical Deposited Copper", ADMETA, 1999, pp. 135–136.
Reid et al., "Process And Material Variables Influencing IC Feature Fill Using Electroplated Copper", ADMETA, 1999, pp. 35–36.
"Logic LSI With Cu Interconnection Becomes Finally Available Cu Embedding With High Aspect Ratio Realized By Electro Plating", Electronic Journal, 1997, pp. 30–31.

* cited by examiner

Primary Examiner—Caridad Everhart
Assistant Examiner—V. Yevisikow
(74) Attorney, Agent, or Firm—Leydig Voit & Mayer, Ltd.

(57) ABSTRACT

Photosensitive insulating films are laminated on lower-layer interconnection layers and a connection hole is formed in the photosensitive insulating film, and a interconnection groove is formed in the photosensitive insulating film. The upper-layer interconnection layers fill the connection hole and the groove. With this arrangement, it is possible to provide a semiconductor device and a manufacturing method producing a multi-layer interconnection structure, in which the connection hole and the groove are formed in a simple process, yield is improved, and the number of process steps and cost are reduced.

10 Claims, 15 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more specifically to a semiconductor device having a multi-layer interconnection structure for use in an integrated circuit, and a manufacturing method thereof.

2. Description of the Background Art

FIG. 23 and FIGS. 24 to 30 are schematic cross-sectional views that show the structure of a conventional semiconductor device having a multi-layer interconnection structure and a manufacturing method thereof, which are described, for example, on page 30 in "Electronic Journal", December Issue, 1997.

Referring to FIG. 23, an etching stopper layer 115 made of, for example, SiN film (silicon nitride film) is formed on a lower-layer interconnection 114. On the etching stopper layer 115, an interlayer film 101 made of, for example, $SiO_2$ film (silicon oxide film) is formed. On the upper surface of the interlayer film 101, a groove 102a that for filling with interconnection and a connection hole 101a that reaches the lower-layer interconnection 114 from the bottom surface of the groove 102a are formed.

A barrier metal 103 made of, for example, TaN (tantalum nitride) film is formed along the inner surface of the connection hole 101a and the groove 102a, and a Cu film 104 is formed so as to be embedded in the connection hole 101a and the groove 102a. The barrier metal 103 and the Cu film 104 constitute an upper interconnection.

Next, an explanation will be given of the manufacturing method of the conventional semiconductor device shown in FIG. 23.

Referring to FIG. 24, the etching stopper layer 115 and the interlayer film 101 are successively formed on the lower-layer interconnection 114 by a plasma CVD (Chemical Vapor Deposition) method.

Referring to FIG. 25, after photoresist has been applied to the interlayer film 101, this is exposed and developed to form a resist pattern 121a having a pattern of connection holes.

Referring to FIG. 26, the interlayer film 101 is subjected to a dry etching process using this resist pattern 121a as a mask. Thus, a hole 101a that reaches the etching stopper layer 115 is formed in the interlayer film 101. Thereafter, the resist pattern 121a is removed by ashing and a chemical treatment.

Referring to FIG. 27, after photoresist has been applied to the interlayer film 101, this is exposed and developed to form a resist pattern 121b having a pattern of grooves.

Referring to FIG. 28, the interlayer film 101 is subjected to a dry etching process using this resist pattern 121b as a mask to form a groove 102a used for interconnection in the interlayer film 101. Thereafter, the resist pattern 121b is removed by ashing and a chemical treatment.

Referring to FIG. 29, the etching stopper layer 115 exposed from the hole 101a is removed by the dry etching process so that one portion of the surface of the lower-layer interconnection 114 is exposed.

Referring to FIG. 30, a barrier metal 103 and a seed layer for a plating film are formed on the interlayer film 101. With respect to the barrier metal, a TaN film is used, and a Cu film is used as the seed layer. The TaN film 30 is formed with a thickness of 20 nm by, for example, a sputtering method, and the Cu film forming the seed layer is formed with a thickness of 200 nm by, for example, a sputtering method. Thereafter, Cu is deposited by an electrolytic plating method in a manner so as to fill the groove 102a and the connection hole 101a, thereby forming a Cu film 104.

Then, the Cu film 104 and the barrier metal 103 are abraded and removed by a chemical mechanical polishing method (CMP method) until the upper surface of the interlayer film 101 has been exposed, and allowed to remain only in the connection hole 101a and the groove 102a so as to form interconnection. The above-mentioned processes are repeated to form multi-layer interconnection.

Since the conventional semiconductor device having a multi-layer interconnection structure is designed as described above, the depth of etching of the hole 101a has a value that corresponds to the sum of the depth of the connection hole and the height of the interconnection, as illustrated in FIG. 26. For this reason, upon forming the hole 101a, an extremely deep etching process is required, and this etching has to be stopped by the thin etching stopper layer 115. Consequently, it is very difficult to carry out etching on the hole 101a, with the result that, due to a reduction in the margin of safety of the process, problems arise in which the etching finishes before the connection hole 101a has been completely opened, causing an insufficient opening or, in contrast, penetration occurs in the etching layer 115.

The insufficient opening causes insufficient connection in the connection hole 101a. Moreover, the penetration of the etching stopper layer 115 causes surface oxidation of the lower-layer interconnection 114, resulting in an increase in the connection resistance and insufficient connection. These problems have caused a problem of an extreme reduction in the yield of the multi-layer interconnection.

SUMMARY OF THE INVENTION

An object of the present invention is to provide a semiconductor device having a multi-layer structure and a manufacturing method thereof, which is possible to form a connection hole and a groove by using a simple process, and consequently to improve the yield as well as to reduce the number of processes and the production costs.

According to the present invention, there is provided a semiconductor device having a multi-layer interconnection structure in which a lower-layer interconnection and an upper-layer interconnection are laminated with an insulating film interpolated in between, wherein the insulating film has a groove filled with the upper layer interconnection on its upper surface, a connection hole for connecting the upper-layer interconnection and the lower-layer interconnection, and a photosensitive film.

In accordance with the semiconductor device of the present invention, the insulating film has a photosensitive property; therefore, after the insulating film has been exposed, this is developed so that a groove and a connection hole are formed. In this developing process, since only the photosensitive insulating film can be selectively removed, it is possible to prevent penetration through the stopper layer located beneath the photosensitive insulating film. Therefore, since the developing time and other conditions can be set without the need of taking the penetration of the stopper layer into consideration, it is possible to effectively prevent the insufficient opening. Consequently, it becomes possible to improve the yield and also to reduce the number of processes and the production costs.

Here, the photosensitive insulating film of the present invention refers to an insulating film whose solubility to a developing solution changes from a soluble state to an insoluble state or from an insoluble state to a soluble state, upon irradiation with light or energy particles.

In the above-mentioned semiconductor device, the insulating film preferably provided has a structure in which a lower-layer insulating film and an upper-layer insulating film that are exposed to mutually different wavelengths are laminated, and a connection hole is formed in the lower-layer insulating film and a groove is formed on the upper-layer insulating film.

With this arrangement, the connection hole and the groove are formed in a separate manner by changing only the wavelength of exposure light.

In the above-mentioned semiconductor device, the wavelength to which the lower-layer insulating film is exposed is set to be shorter than the wavelength to which the upper-layer insulating film is exposed.

With this arrangement, it becomes possible to form the connection hole and the groove by using fewer processes.

In the above-mentioned semiconductor device, the insulating film preferably has a structure in which a lower-layer insulating film and an upper-layer insulating film that have mutually different sensitivities are stacked, and a connection hole is formed in the lower-layer insulating film and a groove is formed in the upper-layer insulating film.

With this arrangement, it becomes possible to form the connection hole and the groove in a separate manner by changing only the dose of exposure.

In the above-mentioned semiconductor device, the sensitivity that the lower-layer insulating film is exposed is set to be lower than the sensitivity that the upper-layer insulating film is exposed.

With this arrangement, it becomes possible to form the connection hole and the groove by using fewer processes.

In the above-mentioned semiconductor device, the insulating film preferably has a structure in which a lower-layer insulating film and an upper-layer insulating film that are exposed to mutually different exposure sources are stacked, and a connection hole is formed in the lower-layer insulating film and a groove is formed on the upper-layer insulating film.

With this arrangement, it is possible to form the connection hole and the groove in a separate manner by changing only the exposure source.

In the above-mentioned semiconductor device, more preferably, the lower-layer insulating film is exposed to two kinds of exposure sources, and the upper-layer insulating film is exposed to any one of the two kinds of exposure sources.

With this arrangement, it becomes possible to form the connection hole and the groove by using fewer processes.

In the above-mentioned semiconductor device, the insulating film preferably has a structure in which a first photosensitive insulating film, an exposure source absorption film and a second photosensitive insulating film are stacked in succession, and a connection hole is formed in the first photosensitive insulating film and a groove is formed on the second photosensitive insulating film.

Since the exposure source absorption film is formed, only the second photosensitive insulating film as the upper layer can be exposed, while the first photosensitive insulating film as the lower layer is left unexposed. Thus, it is possible to form the connection hole and the groove in a separate manner.

Here, the exposure source absorption film in the present invention refers to an insulating film that has an absorbing body with respect to light having a specific wavelength or specific energy particles.

In the above-mentioned semiconductor device, more preferably, the insulating film is formed by a single layer.

Even when the photosensitive insulating film is formed by a single layer, the connection hole and the groove can be formed in a separate manner by changing the dose of exposure of the exposure light.

In the above-mentioned semiconductor device, more preferably, the connection hole is formed so as to be located only within an area below the groove.

With this arrangement, it is possible to prevent the formation area of the connection hole from sticking out from the area below the groove, and consequently to be able to reduce the interconnection intervals.

In the above-mentioned semiconductor device, more preferably, the width of the groove and the aperture width of the connection hole are set to be virtually the same, and the side wall of the groove and the side wall of the connection hole constitute a virtually continuous surface.

With this arrangement, it is possible to prevent the formation area of the connection hole from sticking out from the area below the groove, and consequently to reduce the interconnection intervals.

The manufacturing method of a semiconductor device of the present invention, which is a process for manufacturing a semiconductor device having a multi-layer interconnection structure in which a lower-layer interconnection and an upper-layer interconnection are laminated with an insulating film interpolated in between, is characterized in that, after the insulating film having a photosensitive property has been exposed, this is then developed so that a groove for filling with the upper-layer interconnection is formed on the upper surface thereof while a connection hole for connecting the upper-layer interconnection and the lower-layer interconnection is formed below the groove.

In accordance with the manufacturing method of a semiconductor device of the present invention, the insulating film has a photosensitive property; therefore, after the insulating film has been exposed, this is developed so that a groove and a connection hole are formed. In this developing process, since only the photosensitive insulating film can be selectively removed, it is possible to prevent penetration through the stopper layer located beneath the photosensitive insulating film. Therefore, since the developing time and other conditions can be set without the need of taking the penetration of the stopper layer into consideration, it is possible to effectively prevent the insufficient opening. Consequently, it becomes possible to improve the yield and also to reduce the number of processes and the production costs.

In the above-mentioned manufacturing method of a semiconductor device, the insulating film is preferably formed to a structure in which a lower-layer insulating film and an upper-layer insulating film that are exposed to mutually different wavelengths are laminated, and the lower-layer insulating film is exposed by a first wavelength to form a connection hole therein, and the upper-layer insulating film is exposed by a second wavelength that is different from the first wavelength to form a groove therein.

With this arrangement, the connection hole and the groove are formed in a separate manner by changing only the wavelength of exposure light.

In the above-mentioned manufacturing method of a semiconductor device, more preferably, the first wavelength is shorter than the second wavelength.

With this arrangement, it becomes possible to form the connection hole and the groove by using fewer processes.

In the above-mentioned manufacturing method of a semiconductor device, the insulating film is preferably formed to a structure in which a lower-layer insulating film and an upper-layer insulating film that have mutually different sensitivities are stacked, and the lower-layer insulating film is exposed by a first dose of exposure to form a connection hole therein, and the upper-layer insulating film is exposed by a second dose of exposure that is different from the first dose of exposure to form a groove therein.

With this arrangement, it becomes possible to form the connection hole and the groove in a separate manner by changing only the dose of exposure.

In the above-mentioned manufacturing method of a semiconductor device, more preferably, the first dose of exposure is greater than the second dose of exposure.

With this arrangement, it becomes possible to form the connection hole and the groove by using fewer processes.

In the above-mentioned manufacturing method of a semiconductor device, the insulating film is preferably formed to a structure in which a lower-layer insulating film and an upper-layer insulating film that are exposed to mutually different exposure sources are stacked, and the lower-layer insulating film is exposed by a first exposure source to form a connection hole therein, and the upper-layer insulating film is exposed by a second exposure source that is different from the first exposure source to form a groove therein.

With this arrangement, it is possible to form the connection hole and the groove in a separate manner by changing only the exposure source.

In the above-mentioned manufacturing method of a semiconductor device, the insulating film is preferably formed to a structure in which a first photosensitive insulating film, an exposure source absorption film and a second photosensitive insulating film are laminated in succession, and a first exposure forms a connection hole in the first photosensitive insulating film and a second exposure forms a groove on the second photosensitive insulating film.

Since the exposure source absorption film is formed, only the second photosensitive insulating film as the upper layer can be exposed, while the first photosensitive insulating film as the lower layer is left unexposed. Thus, it is possible to form the connection hole and the groove in a separate manner.

In the above-mentioned manufacturing method of a semiconductor device, more preferably, the insulating film is formed by a single photosensitive insulating film.

With this arrangement, it is possible to simplify the structure and the manufacturing processes.

In the above-mentioned manufacturing method of a semiconductor device, more preferably, the single photosensitive insulating film is exposed by a first dose of exposure to form a connection hole therein, and the single photosensitive insulating film is also exposed by a second dose of exposure that is different from the first dose of exposure to form a groove therein.

With this arrangement, the groove and the hole can be formed even in the single photosensitive insulating film.

In the above-mentioned manufacturing method of a semiconductor device, more preferably, the first dose of exposure is greater than the second dose of exposure.

With this arrangement, the connection hole and the groove can be formed by using fewer processes.

In the above-mentioned manufacturing method of a semiconductor device, more preferably, the exposing process for the groove and the exposing process for the connection hole are carried out at the same time.

With this arrangement, the connection hole and the groove can be formed by using fewer processes, and it is possible to form a structure in which the groove and the connection hole are completely overlapped with each other, and consequently to be able to narrow the intervals of the interconnections.

In the above-mentioned manufacturing method of a semiconductor device, more preferably, the exposing process for the groove and the exposing process for the connection hole are carried out at the same time so that the connection hole is formed so as to be located only at a position within an area below the groove.

With this arrangement, it is possible to prevent the formation area of the connection hole from sticking out from the area below the groove, and consequently to reduce the interconnection intervals.

In the above-mentioned manufacturing method of a semiconductor device, more preferably, the width of the groove and the aperture width of the connection hole are set to be virtually the same, and the side wall of the groove and the side wall of the connection hole constitute a virtually continuous surface.

With this arrangement, it is possible to prevent the formation area of the connection hole from sticking out from the area below the groove, and consequently to be able to reduce the interconnection intervals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to Figures, the following description will discuss preferred embodiments of the present invention.
(First Embodiment)

Figure 1:
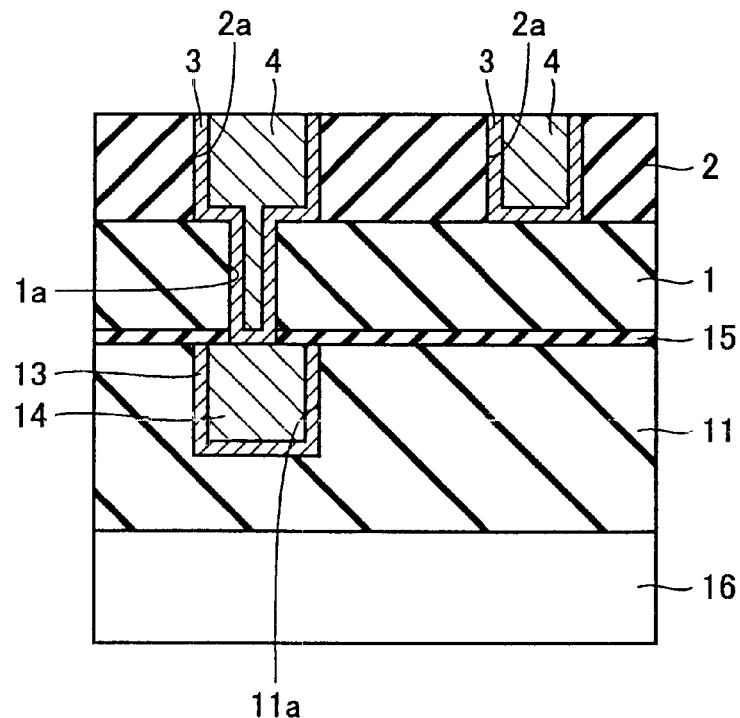
FIG. 1 is a schematic cross-sectional view that shows a structure of a semiconductor device in accordance with a first embodiment of the present invention.

Referring to FIG. 1, an interlayer insulating film 11 is formed on a semiconductor substrate or a lower-layer interlayer film 16. A groove 11a is formed on the upper surface of the interlayer insulating film 11, and a lower-layer interconnection constituted by a barrier metal 13 and a Cu film 14 is filled in into the groove 11a. A stopper layer 15 made of, for example, SiN is formed on the lower-layer interconnections 13, 14, with a thickness of 100 nm. Photosensitive insulating layers 1 and 2 are laminated on this stopper layer 15.

Each of the photosensitive insulating films 1 and 2 is made from a material such as a photosensitive SOG material PS-MSZ (hereinafter, referred to as PS-MSZ) made by Crarient Co., Ltd. The PS-MSZ is formed by adding a photoacid generating agent to methylsilazane as a photosensitive agent. The photosensitive insulating film 1 contains a photosensitive agent that is exposed to, for example, KrF excimer laser (wavelength:248 nm), and the photosensitive insulating film 2 contains a photosensitive agent that is exposed to, for example, i rays (wavelength:365 nm). Each of the photosensitive insulating films 1 and 2 has a film thickness of, for example, 1 $\mu$m.

Here, since the photosensitive agent absorbs light having not less than a certain quantity of energy and is allowed to react, the photosensitive agent exposed to i rays is also exposed to the KrF excimer laser.

A interconnection groove 2a is formed in the photosensitive insulating film 2, and a connection hole 1a is formed in the photosensitive insulating film 1 below the groove 2a. A barrier metal 3 is formed on the inner surfaces of the connection hole 1a and the groove 2a, and a Cu film 4 is formed so as to be filled in into the connection hole 1a and the groove 2a. The barrier metal 3 and the Cu film 4 constitute an upper-layer interconnection. The upper surfaces of the upper-layer interconnections 3 and 4 are virtually the same plane with the upper surface of the photosensitive insulating film 2.

The following description will discuss a manufacturing method of the present embodiment.

Figure 2:
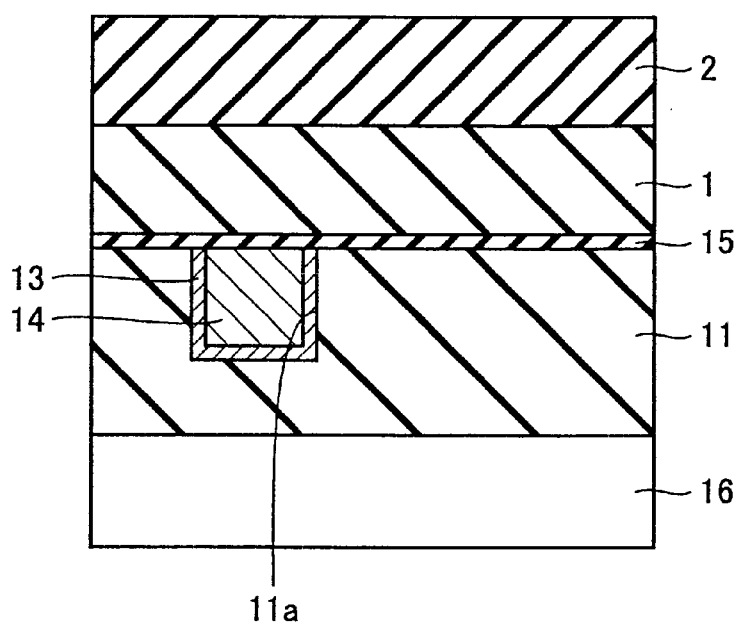
FIGS. 2 through 6 are schematic cross-sectional views that show a sequence of processes of a manufacturing method of the semiconductor device in accordance with the first embodiment of the present invention.

Referring to FIG. 2, first, a semiconductor substrate or a lower-layer interlayer film 16, an interlayer insulating film 11 and lower interconnections 13, 14 are formed. Each of the lower-layer-layer interconnections 13, 14 is formed by, for example, a barrier metal 13 and a Cu film 14. A stopper layer 15 is formed on the lower-layer interconnections 13, 14 by, for example, a plasma CVD method. Photosensitive insulating films 1 and 2 are successively formed on the stopper layer 15 by coating, and this is then pre-baked. Each of the photosensitive insulating films 1 and 2 is formed by, for example, the above-mentioned material, PS-MSZ, with a thickness of, for example, 1 $\mu$m.

Figure 3:
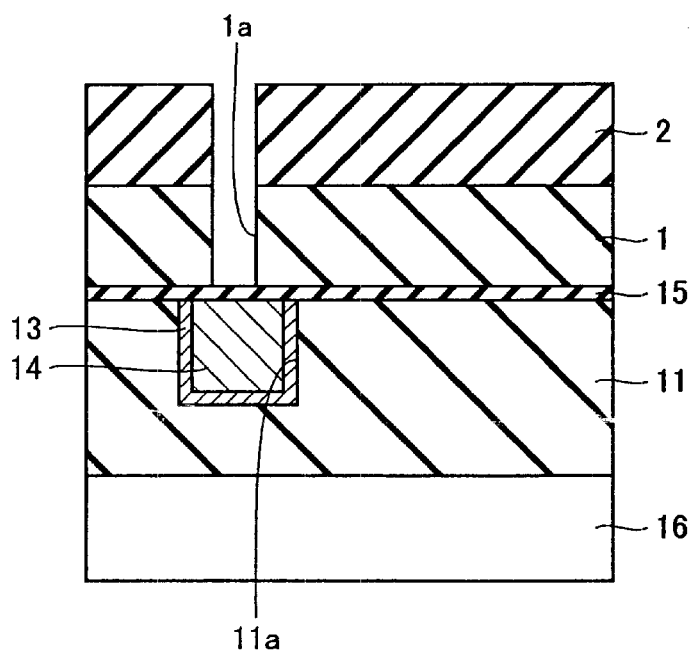

Referring to FIG. 3, a pattern of a connection hole 1a is transferred on the photosensitive insulating films 1 and 2, and developed thereon to form the connection hole 1a. At this time, the transferring process is carried out by using, for example, KrF excimer laser. For this reason, both of the photosensitive insulating films 1 and 2 are exposed so that the pattern of the connection hole 1a can be transferred thereon.

Figure 4:
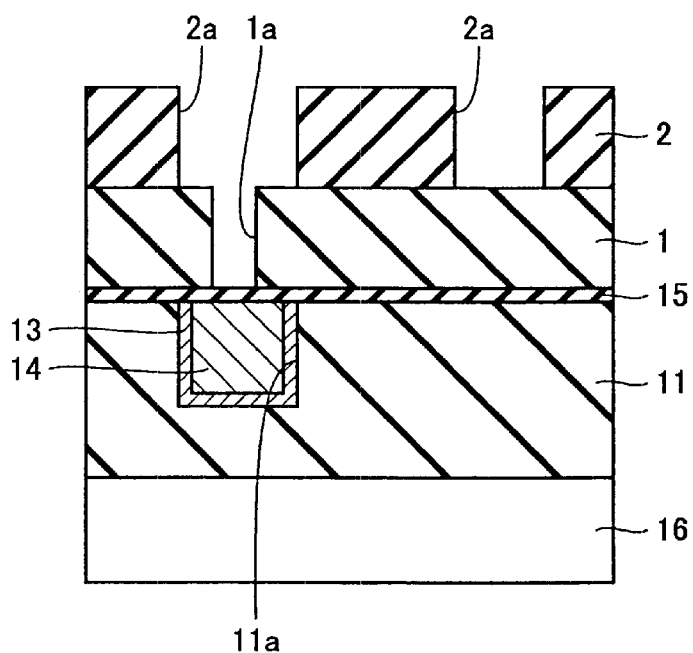

Referring to FIG. 4, a pattern of a groove 2a is transferred onto the photosensitive insulating film 2, and developed thereon to form the interconnection groove 2a. At this time, the transferring process is carried out by using, for example, i rays. Here, only the photosensitive insulating film 2 is exposed to the i rays, while the photosensitive insulating film 1 is not exposed thereto; thus, it is possible to transfer the pattern of the interconnection groove 2a only on the photosensitive insulating film 2.

Figure 5:
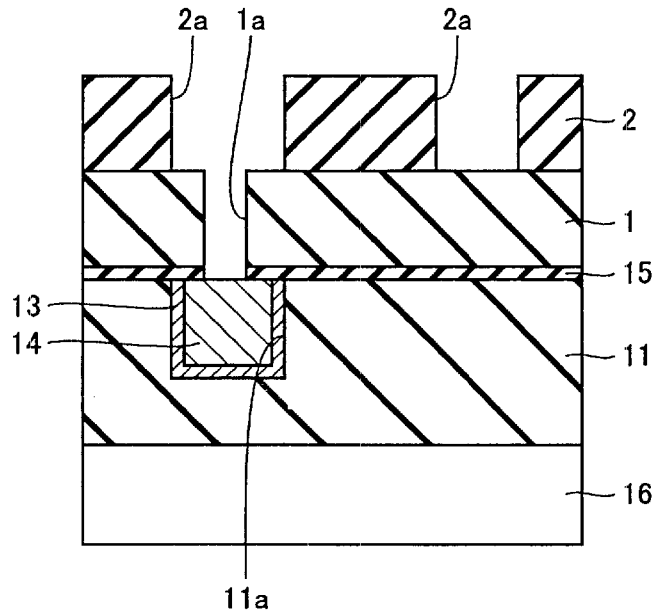

Referring to FIG. 5, the stopper layer 15 exposed from the connecting hole 1a is removed by dry etching. Thus, one portion of the surface of the lower-layer interconnections 13, 14 is exposed.

Figure 6:
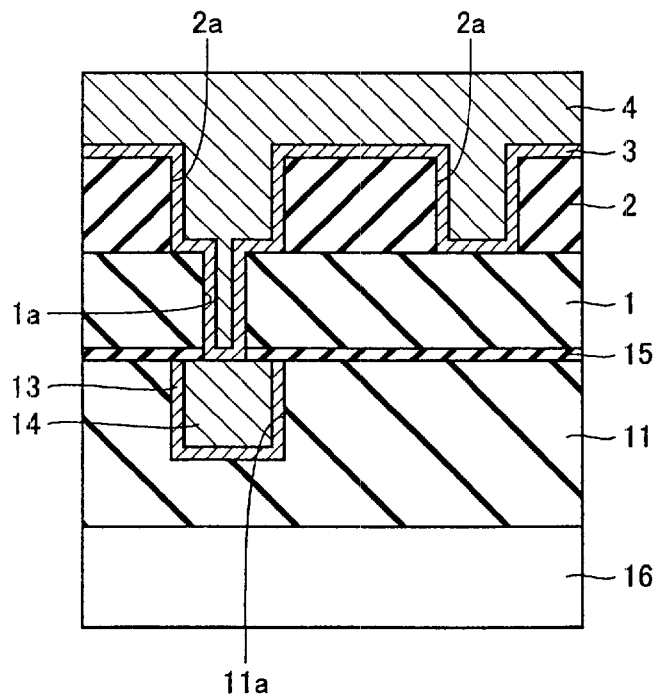

Referring to FIG. 6, a TaN film is formed on the photosensitive insulating films 1 and 2 as the barrier metal 3, and a Cu film 4 is formed on the TaN film. The TaN film 3 is formed by, for example, sputtering with a thickness of 20 nm. For example, the Cu film 4 is formed as follows: after a Cu seed layer has been formed by sputtering with a thickness of 200 nm, Cu is deposited on the seed layer by an electrolytic plating method. The connection hole 1a and the groove 2a are filled with the Cu film 4. With respect to a solution for the electrolytic plating, for example, a copper sulfate bath is used.

Thereafter, the Cu film 4 and the barrier metal 3 are abraded and removed by the CMP method until the upper surface of the photosensitive insulating film 2 has been exposed so that these are only allowed to remain in the connection hole 1a and the groove 2a, thereby forming upper-layer interconnections 3, 4. The above-mentioned processes are repeated so that multi-layer interconnection is formed.

Figure 7A:
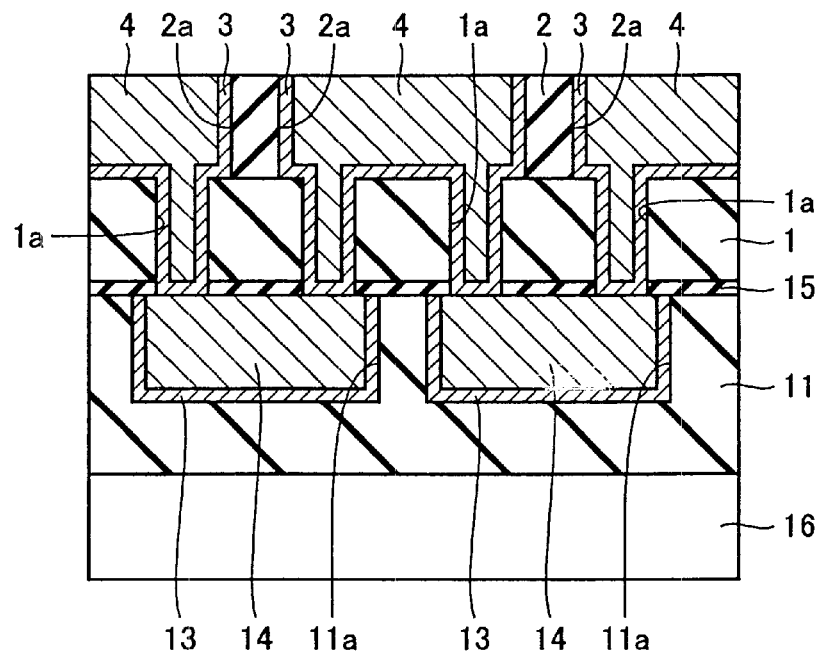
FIGS. 7A and 7B are schematic cross-sectional views that show structures of via hole chains manufactured by the method of the first embodiment and a conventional method.
Figure 7B:
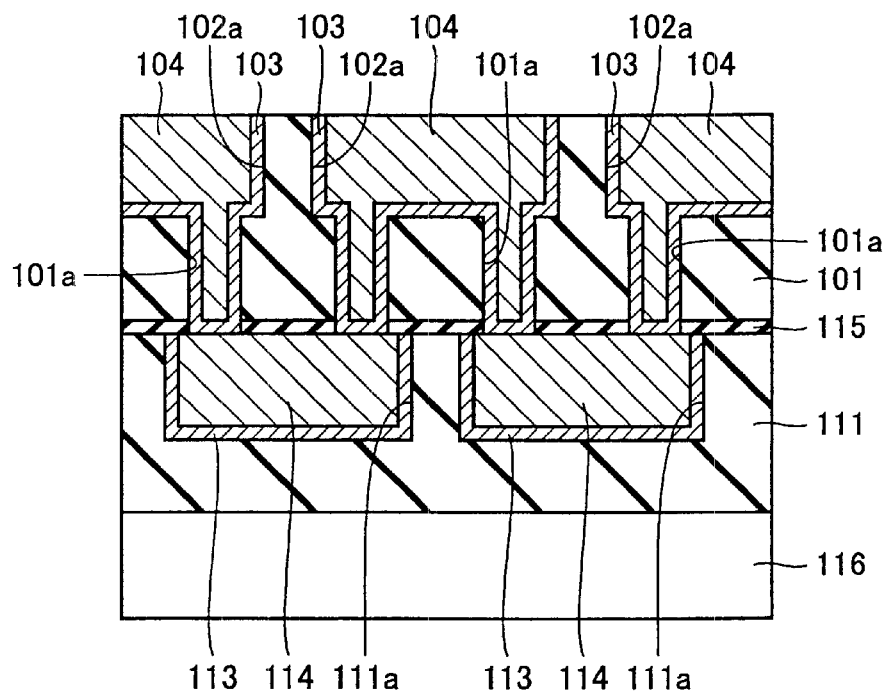

By using the method as described above, via chains as shown in FIG. 7A were formed. For reference purposes, a via chain as shown in FIG. 7B was formed by a conventional method in the same manner. The number of via holes of the via hole chain was set to 3000, and the via diameter was set to 0.4 $\mu$m. Table 1 shows the yield and dispersion of resistance.

TABLE 1

Yield and dispersion of resistance of via hole chain

|  | Yield | Dispersion of resistance |
| --- | --- | --- |
| Present Embodiment | 100% | 6% |
| Conventional Example | 87% | 14% |

The results show that the manufacturing method of the present embodiment is superior to the conventional example both in the yield and dispersion of resistance (standard deviation/average value).

Here, the present embodiment has exemplified a case in which the connection hole 1a is formed prior to the formation of the interconnection groove 2a; however, the interconnection groove 2a may be formed prior to the connection hole 1a, and even in this case, the same effects as described above can be obtained. Moreover, the same is true for the second to sixth embodiments which will be described below.

Here, the present embodiment has exemplified a case in which the stopper layer 15 is formed on the lower-layer interconnection; however, the stopper layer 15 may be omitted, and even in this case, the same effects as described above can be obtained. Moreover, the same is true for embodiments which will be described below.

(Second Embodiment)

The first embodiment has exemplified a case in which the photosensitive insulating films 1 and 2 that are exposed to mutually different wavelengths are used; however, the photosensitive insulating films 1 and 2 that have mutually different sensitivities may be used. Referring to FIGS. 1 to 6, the following description will discuss the second embodiment in which the photosensitive insulating films 1 and 2 that have mutually different sensitivities are used.

Referring to FIG. 1, in comparison with the first embodiment, the structure of the present embodiment is different in the structures of the photosensitive insulating films 1 and 2. The materials of photosensitive insulating films 1 and 2 are, for example, PS-MSZ, and each film thickness is set to, for example, 1 μm. Here, the sensitivity of the photosensitive insulating film 1 is set to be lower than the sensitivity of the photosensitive insulating film 2. The sensitivity of each photosensitive insulating film is controlled by changing the amount of the photosensitive agent in the insulating film. Table 2 shows the relationship between the sensitivity and the amount of the photosensitive agent.

TABLE 2

Amount of photosensitive agent and sensitivity thereof

| Amount of photosensitive agent (mass %) | 12.5 | 20 | 25 | 50 | 75 | 100 |
|---|---|---|---|---|---|---|
| Appropriate dose of exposure ($\mu C/cm^2$) | 32.4 | 24.2 | 20 | 13.4 | 9.8 | 8 |

Since the other structures except for these are virtually the same as the structures of the first embodiment, the same members are indicated by the same reference numbers, and the description thereof is omitted.

Next, an explanation will be given of the manufacturing method of the present embodiment.

Referring to FIG. 2, a semiconductor substrate or a lower-layer interlayer film 16, an interlayer insulating film 11 and lower-layer interconnections 13, 14 are formed in the same manner as the first embodiment. A stopper layer 15 is formed on the lower-layer interconnections 13, 14 by, for example, a plasma CVD method. Photosensitive insulating films 1 and 2 are successively formed on the stopper layer 15 by coating, and then pre-baked. Each of the photosensitive insulating films 1 and 2 is formed by, for example, PS-MSZ, with a thickness of, for example, 1 μm. Here, the sensitivity of the photosensitive insulating film 1 is set to be lower than the sensitivity of the photosensitive insulating film 2 by changing the amount of the photosensitive agent in the insulating film.

Referring to FIG. 3, a pattern of a connection hole 1a is transferred on the photosensitive insulating films 1 and 2, and developed thereon to form the connection hole 1a. In this transferring process, the exposure is carried out by using i rays. By increasing the dose of exposure, not only the second photosensitive insulating film 2, but also the first photosensitive insulating film 1 having a lower sensitivity can be exposed.

Referring to FIG. 4, a pattern of a interconnection groove 2a is transferred on the photosensitive insulating film 2, and developed thereon to form the interconnection groove 2a. In this transferring process, the exposure is carried out by using i rays, and at this time, the dose of exposure is set to be smaller in conformity with the photosensitive insulating film 2 having the higher sensitivity so that the photosensitive insulating film 1, placed as the lower layer, is not exposed.

Referring to FIG. 5, the stopper layer 15 exposed from the connecting hole 1a is removed by dry etching. Thus, one portion of the surface of the lower-layer interconnections 13, 14 is exposed.

Referring to FIG. 6, a barrier metal 3 made of a TaN film and a Cu film 4 are formed in the same manner as the first embodiment, and these are then abraded and removed by the CMP method, thereby forming upper-layer interconnections 3, 4 as shown in FIG. 1. The above-mentioned processes are repeated so that multi-layer interconnection is formed.

By using the method as described above, via hole chains as shown in FIG. 7A were formed. For reference purposes, a via hole chain as shown in FIG. 7B was formed by a conventional method in the same manner. The number of via holes of the via hole chain was set to 3000, and the via diameter was set to 0.4 μm. Table 3 shows the yield and dispersion of resistance.

TABLE 3

Yield and dispersion of resistance of via hole chain

|  | Yield | Dispersion of resistance |
|---|---|---|
| Present Embodiment | 100% | 4% |
| Conventional Example | 87% | 14% |

The results show that the manufacturing method of the present embodiment is superior to the conventional example both in the yield and dispersion of resistance (standard deviation/average value).

In comparison with the first embodiment, since the present embodiment uses only one kind of a transferring-use stepper, it is advantageous in terms of costs.

(Third Embodiment)

The first embodiment has exemplified a case in which the photosensitive insulating films 1 and 2 that are exposed to mutually different wavelengths are used; however, the photosensitive insulating films 1 and 2 that are exposed to mutually different exposing sources may be used. Referring to FIGS. 1 to 6, the following description will discuss the third embodiment in which the photosensitive insulating films 1 and 2 that are exposed to mutually different exposing sources are used.

Referring to FIG. 1, in comparison with the first embodiment, the structure of the present embodiment is different in the structures of the photosensitive insulating films 1 and 2. The material of the photosensitive insulating film 1 is, for example, a resin of a non-chemical amplification type that is only exposed to electron beam, and the material of the photosensitive insulating film 2 is, for example, PS-MSZ. The photosensitive agent contained in the photosensitive insulating film 2 is exposed to a KrF excimer laser, and also exposed to electron beams.

In the phenomenon in which exposure is made by a KrF excimer laser, a photosensitive agent absorbs light having its specific wavelength, and excited. In contrast, the electron beam excites the bond of atoms so that the photosensitive agent is excited in the same manner. Since the energy is greater than a threshold value of energy required for allowing the photosensitive agent to react, the reaction progresses. In the resin of the non-chemical amplification type used in the photosensitive insulating film 1, the electron beam excites the atomic bond of molecules constituting the resin and cuts so that the reaction progresses. However, since the resin of the non-chemical amplification type has no property for absorbing the wavelength of KrF excimer laser, it is not exposed to the light.

Since the other structures except for these are virtually the same as the structures of the first embodiment, the same members are indicated by the same reference numbers, and the description thereof is omitted.

Next, an explanation will be given of the manufacturing method of the present embodiment.

Referring to FIG. 2, a semiconductor substrate or a lower-layer interlayer film 16, an interlayer insulating film 11 and lower-layer interconnections 13, 14 are formed in the same manner as the first embodiment. A stopper layer 15 is formed on the lower-layer interconnections 13, 14 by, for example, a plasma CVD method. Photosensitive insulating films 1 and 2 are successively formed on the stopper layer 15 by coating, and then pre-baked. Each of the photosensitive insulating films 1 and 2 is formed with a thickness of, for example, 1 μm. As described above, the photosensitive insulating film 1 is made from a resin of the non-chemical amplification type that is exposed to, for example, electron beams alone, and the photosensitive insulating film 2 is made from, for example, PS-MSZ.

Referring to FIG. 3, a pattern of a connection hole 1a is transferred on the photosensitive insulating films 1 and 2, and developed thereon to form the connection hole 1a. In this transferring process, the exposure is carried out by using an electron beam.

Referring to FIG. 4, a pattern of a interconnection groove 2a is transferred on the photosensitive insulating film 2, and developed thereon to form the interconnection groove 2a. In this transferring process, the exposure is carried out by using a KrF excimer stepper so that only the photosensitive insulating film 2 is exposed.

Referring to FIG. 5, the stopper layer 15 exposed from the connecting hole 1a is removed by dry etching. Thus, one portion of the surface of the lower-layer interconnections 13, 14 is exposed.

Referring to FIG. 6, a barrier metal 3 made of a TaN film and a Cu film 4 are formed in the same manner as the first embodiment, and these are then abraded and removed by the CMP method, thereby forming upper-layer processes are repeated so that multi-layer interconnection is formed.

By using the method as described above, via hole chains as shown in FIG. 7A were formed. For reference purposes, a via hole chain as shown in FIG. 7B was formed by a conventional method in the same manner. The number of via holes of the via hole chain was set to 3000, and the via diameter was set to 0.4 μm. Table 4 shows the yield and dispersion of resistance.

TABLE 4

Yield and dispersion of resistance of via hole chain

| | Yield | Dispersion of resistance |
|---|---|---|
| Present Embodiment | 100% | 4% |
| Conventional Example | 87% | 14% |

The results show that the manufacturing method of the present embodiment is superior to the conventional example both in the yield and dispersion of resistance (standard deviation/average value).

In comparison with the first embodiment, the present embodiment has an advantage in that even fine patterns can be used therein.

(Fourth Embodiment)

The third embodiment has exemplified a case in which the photosensitive insulating films 1 and 2 that are exposed to mutually different exposure sources are used; however, the same photosensitive insulating films 1 and 2 may be used. Referring to FIGS. 8 to 13, the following description will discuss the fourth embodiment in which the same photosensitive insulating films 1 and 2 are used.

Figure 8:
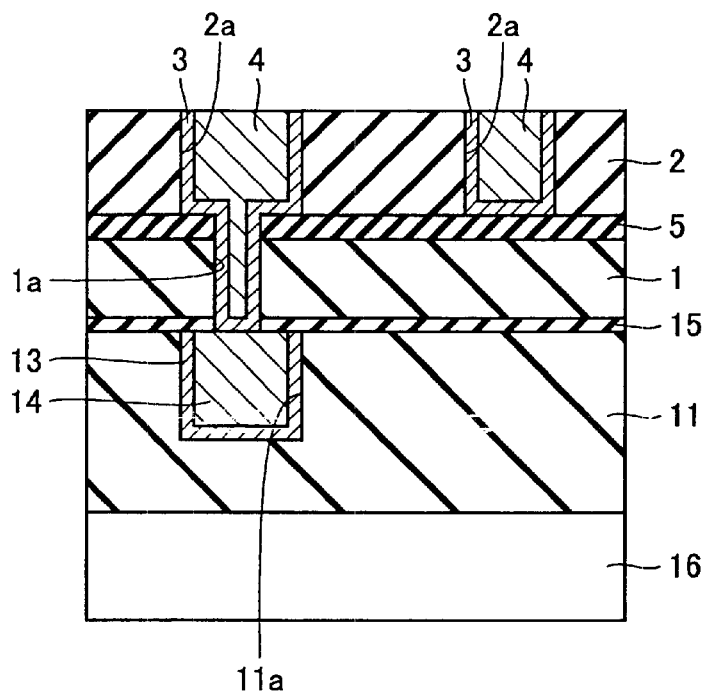
FIG. 8 is a schematic cross-sectional view that shows a structure of a semiconductor device in accordance with a fourth embodiment of the present invention.

Referring to FIG. 8, the structure of the present embodiment is different from the structure of the third embodiment in that the photosensitive insulating films 1 and 2 are made from the same material and in that an absorbing film 5 to an exposure source is interpolated between the photosensitive insulating films 1 and 2. The material of the photosensitive insulating films 1 and 2 is, for example, PS-MSZ, and the film thickness thereof is set to, for example, 1 μm. Both of the photosensitive insulating films 1 and 2 are exposed to a KrF excimer laser, and also exposed to electron beams. Moreover, the absorbing film 5 to the exposure source is made from a material, such as Ta (tantalum) oxide, with a film thickness of 50 nm.

Since the other structures except for these are virtually the same as the structures of the third embodiment, the same members are indicated by the same reference numbers, and the description thereof is omitted.

Next, an explanation will be given of the manufacturing method of the present embodiment.

Figure 9:
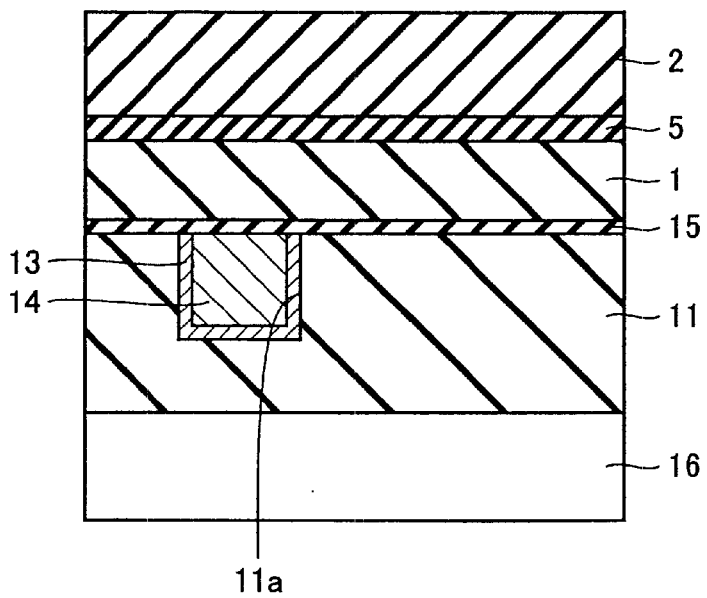
FIGS. 9 through 13 are schematic cross-sectional views that show a sequence of processes of a manufacturing method of the semiconductor device in accordance with the fourth embodiment of the present invention.

Referring to FIG. 9, a semiconductor substrate or a lower-layer interlayer film 16, an interlayer insulating film 11 and lower-layer interconnections 13, 14 are formed in the same manner as the first embodiment. A stopper layer 15 is formed on the lower-layer interconnections 13, 14 by, for example, a plasma CVD method. A photosensitive insulating film 1 is formed on the stopper layer 15 by coating, and then pre-baked. On this photosensitive insulating film 1, for example, a Ta oxide, which serves as an absorbing film 5 to the exposure source, is formed by a sputtering method with a thickness of 50 nm. On this absorbing film 5, a photosensitive insulating film 2 is formed by coating, and then pre-baked. Each of the photosensitive insulating films 1 and 2 has a film thickness of, for example, 1 μm, and the material is, for example, PS-MSZ.

Figure 10:
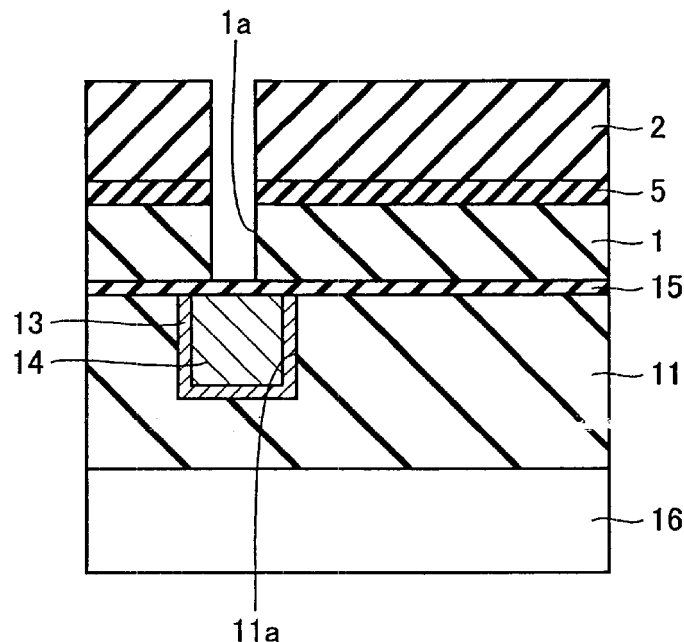

Referring to FIG. 10, a pattern of a connection hole 1a is transferred on the photosensitive insulating films 1 and 2, and developed thereon to form the connection hole 1a. In this transferring process, the exposure is carried out by a KrF excimer laser.

Figure 11:
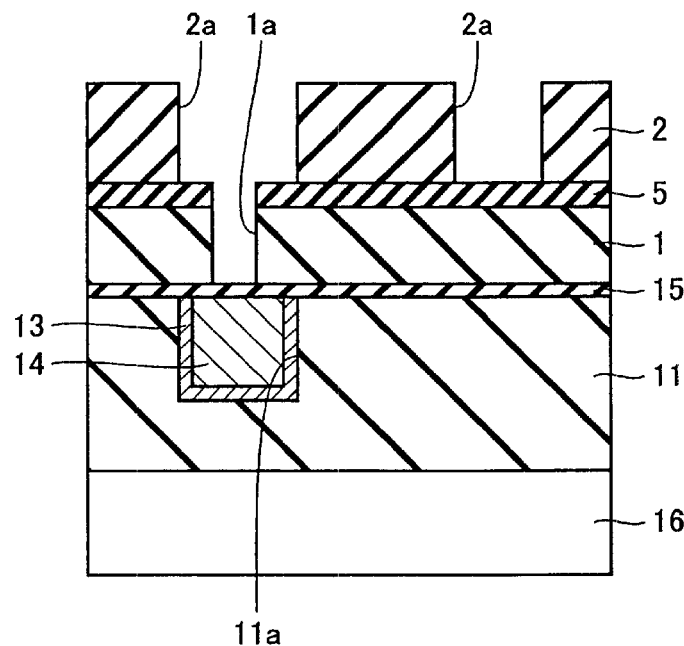

Referring to FIG. 11, a pattern of a interconnection groove 2a is transferred on the photosensitive insulating film 2, and developed thereon to form the interconnection groove 2a. In this transferring process, the exposure is carried out by an electron beam. The electron beam is absorbed and reflected by the absorbing film 5 that is formed between the photosensitive insulating film 1 and the photosensitive insulating film 2. For this reason, only the photosensitive insulating film 2 is exposed, while the photosensitive insulating film 1 is left unexposed.

Figure 12:
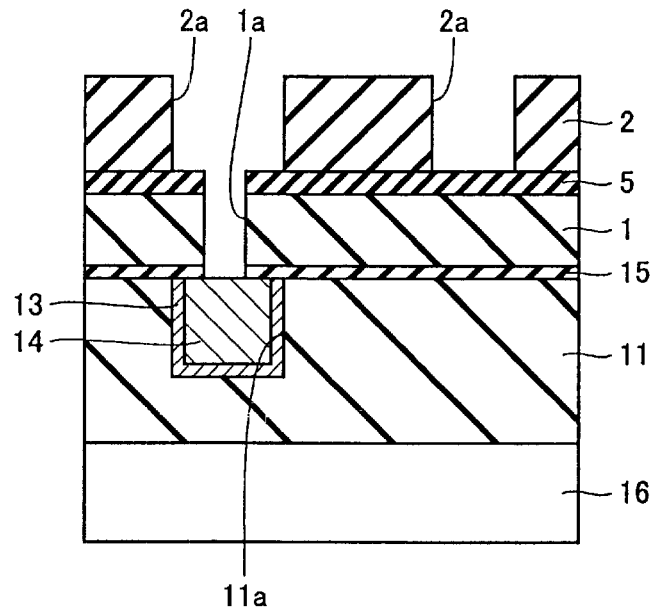

Referring to FIG. 12, the stopper layer 15 exposed from the connecting hole 1a is removed by dry etching. Thus, one portion of the surface of the lower-layer interconnections 13, 14 is exposed.

Figure 13:
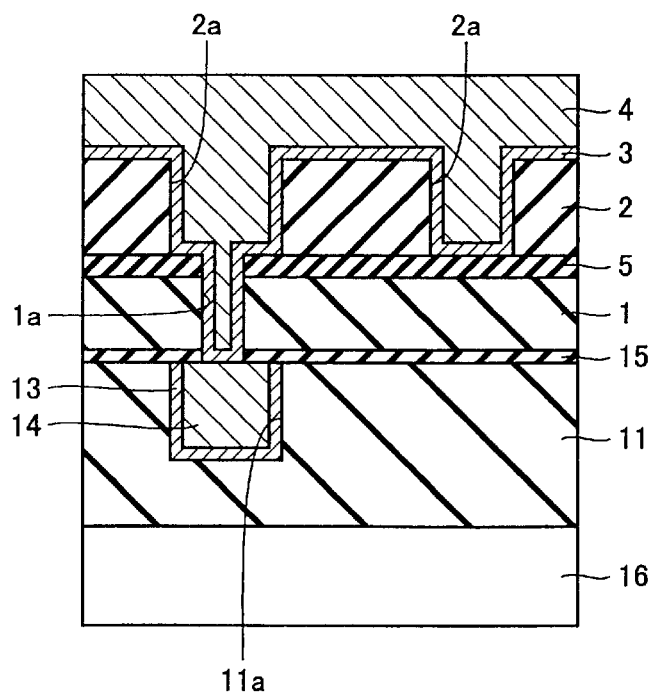

Referring to FIG. 13, a barrier metal 3 made of a TaN film and a Cu film 4 are formed in the same manner as the first embodiment, and these are then abraded and removed by the CMP method, thereby forming upper-layer interconnections 3, 4 as shown in FIG. 8. The above-mentioned processes are repeated so that multi-layer interconnection is formed.

Figure 31:
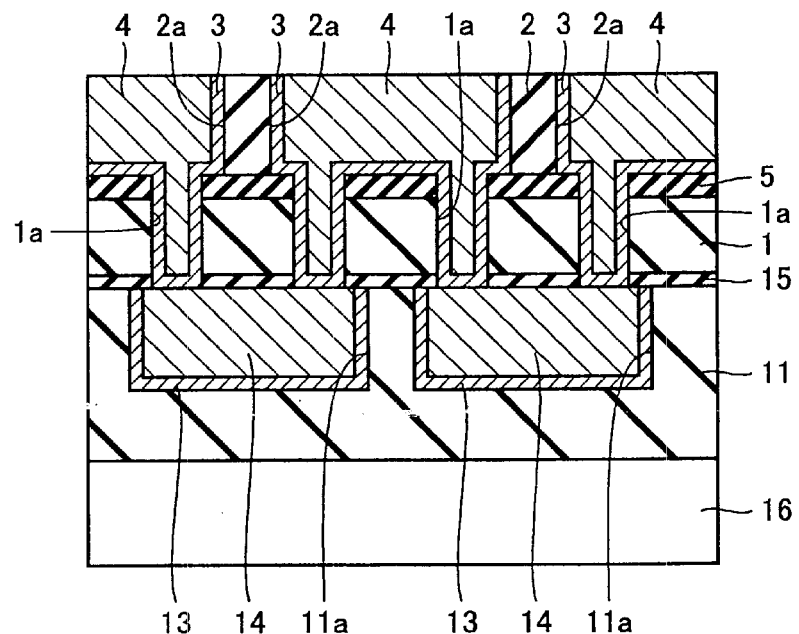
FIG. 31 is schematic cross-sectional views that show a structure of via hole chains manufactured by the method of the fourth embodiment.

By using the method as described above, via hole chains as shown in FIG. 31 were formed. For reference purposes, a via hole chain as shown in FIG. 7B was formed by a conventional method in the same manner. The number of via holes of the via hole chain was set to 3000, and the via diameter was set to 0.4 $\mu$m. Table 5 shows the yield and dispersion of resistance.

TABLE 5

Yield and dispersion of resistance of via hole chain

|  | Yield | Dispersion of resistance |
| --- | --- | --- |
| Present Embodiment | 100% | 7% |
| Conventional Example | 87% | 14% |

The results show that the manufacturing method of the present embodiment is superior to the conventional example both in the yield and dispersion of resistance (standard deviation/average value).

In comparison with the first to third embodiments, since the present embodiment uses the same photosensitive insulating films 1 and 2, it is advantageous in terms of costs.

The present embodiment has exemplified a case in which the KrF excimer laser is used as an exposure source for the connection hole 1a, the electron beam is used as an exposure source for the interconnection groove 2a and the Ta oxide is used as the absorbing film 5; however, the same effects can be obtained even in the case when a film for absorbing the exposure source for the interconnection groove 2a is used as the absorbing film 5. For example, SiON is used as the absorbing film 5, the electron beam is used as the exposure source for the connection hole 1a, and the KrF excimer laser is used as the exposure source for the interconnection groove 2a; thus, the same effects can be obtained. In this case, SiON is controlled in its compositions of O and N so as to absorb the waveform of the KrF excimer laser. Moreover, the elements constituting SiON are light elements so that the electron beam is allowed to easily pass through them.

(Fifth Embodiment)

The first embodiment has exemplified a case in which two kinds of the photosensitive insulating films 1 and 2 are laminated; however, the photosensitive insulating film may be formed as a single layer. Referring to FIGS. 14 to 19, the following description will discuss the fifth embodiment in which the single photosensitive insulating film is used.

Figure 14:
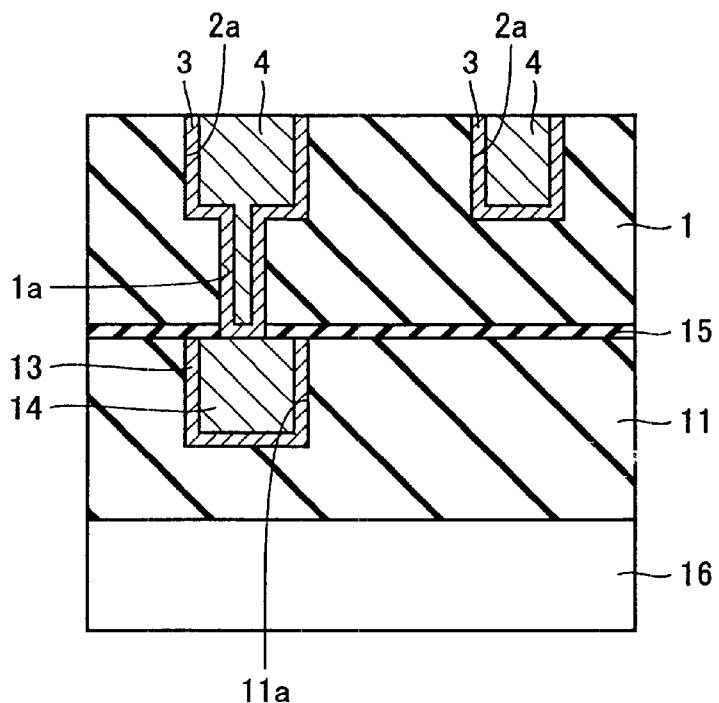
FIG. 14 is a schematic cross-sectional view that shows a structure of a semiconductor device in accordance with a fifth embodiment of the present invention.

Referring to FIG. 14, in comparison with the structure of the first embodiment, the structure of the present invention is different in its structure of the photosensitive insulating film. The photosensitive insulating film 1 is formed as a single photosensitive insulating film made from, for example, PS-MSZ, and its film thickness is set to, for example, 2 $\mu$m.

Since the other structures except for these are virtually the same as the structures of the first embodiment, the same members are indicated by the same reference numbers, and the description thereof is omitted.

Next, an explanation will be given of the manufacturing method of the present embodiment.

Figure 15:
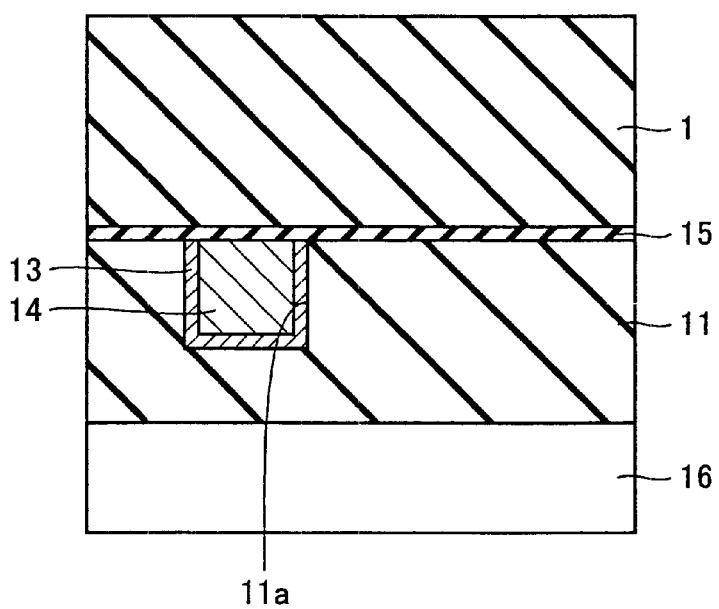
FIGS. 15 through 19 are schematic cross-sectional views that show a sequence of processes of a manufacturing method of the semiconductor device in accordance with a fifth embodiment of the present invention.

Referring to FIG. 15, a semiconductor substrate or a lower-layer interlayer film 16, an interlayer insulating film 11 and lower-layer interconnections 13, 14 are formed in the same manner as the first embodiment. A stopper layer 15 is formed on the lower-layer interconnections 13, 14 by, for example, a plasma CVD method. A photosensitive insulating film 1 is formed on the stopper layer 15 by coating, and this is then pre-baked. The photosensitive insulating film 1 has a thickness of, for example, 2 $\mu$m, and the material is, for example, PS-MSZ.

Figure 16:
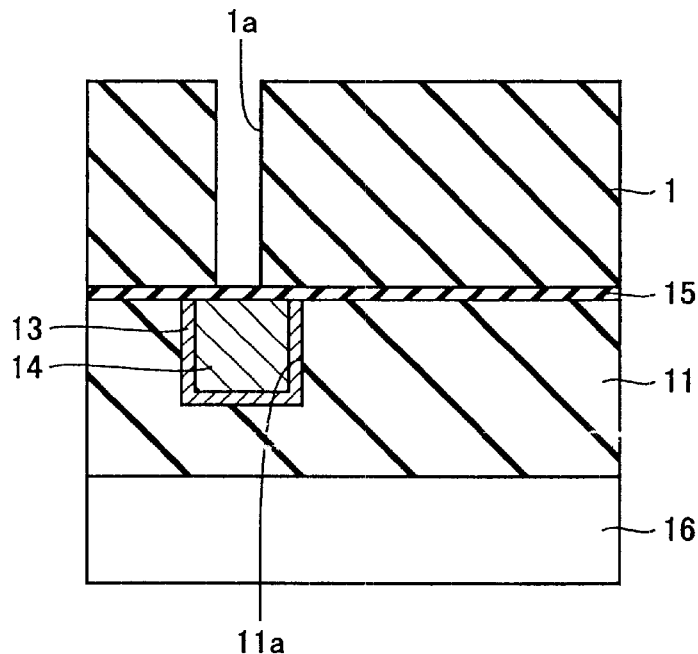

Referring to FIG. 16, a pattern of a connection hole 1a is transferred on the photosensitive insulating film 1, and developed thereon to form the connection hole 1a. In this transferring process, the exposure is carried out by an electron beam. At this time, the dose of exposure is made greater so that the photosensitive insulating film 1 having the thickness of 2 $\mu$m is exposed entirely in its thickness direction.

Figure 17:
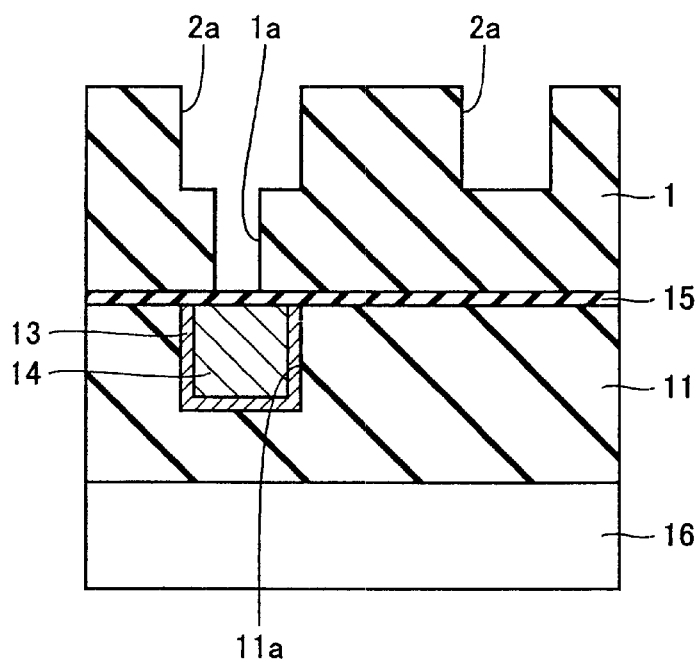

Referring to FIG. 17, a pattern of a groove 2a is transferred on the photosensitive insulating film 1, and developed thereon to form the interconnection groove 2a. In this transferring process, the dose of exposure is made smaller so that only the upper side of the photosensitive insulating film 1 is exposed, while the lower side is left unexposed.

Figure 20:
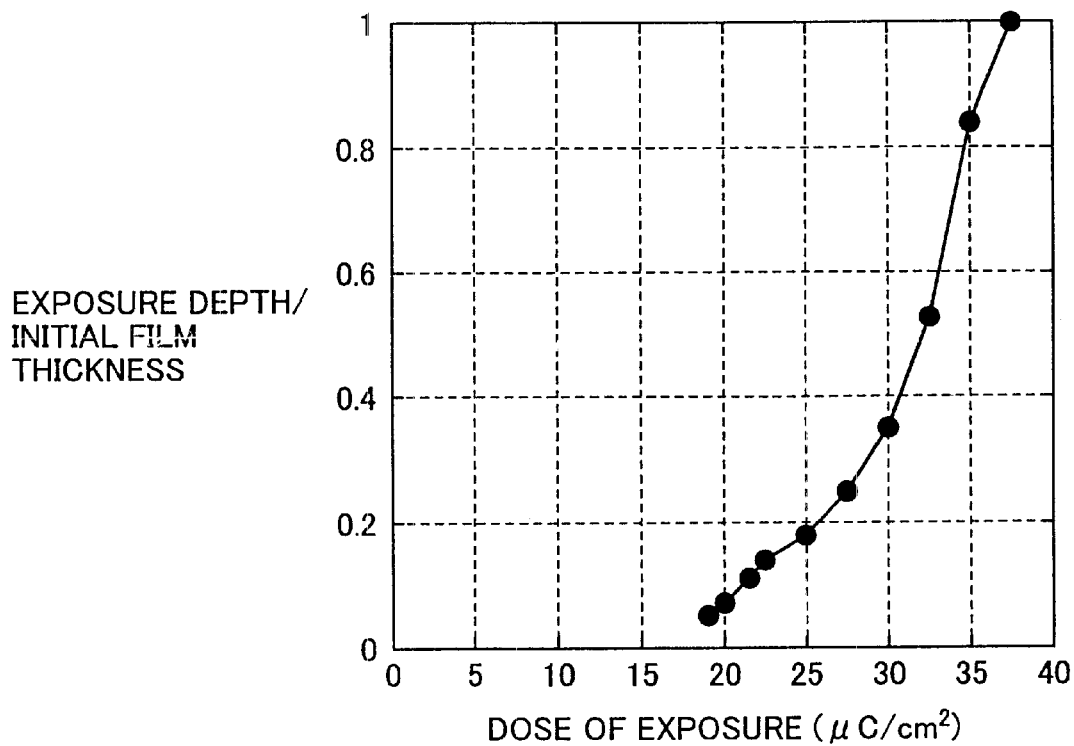
FIG. 20 is a drawing that shows the relationship between the dose of exposure and the depth of exposure.

FIG. 20 shows the relationship between the dose of exposure and the exposure depth. It is possible to finely control the dose of exposure by using the electron beam as the exposure source.

Figure 18:
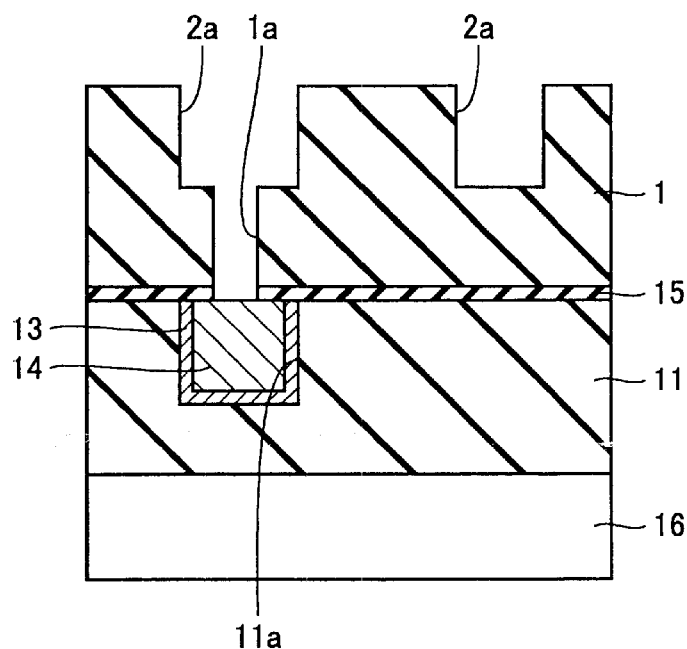

Referring to FIG. 18, the stopper layer 15 exposed from the connecting hole 1a is removed by dry etching. Thus, one portion of the surface of the lower-layer interconnections 13, 14 is exposed.

Figure 19:
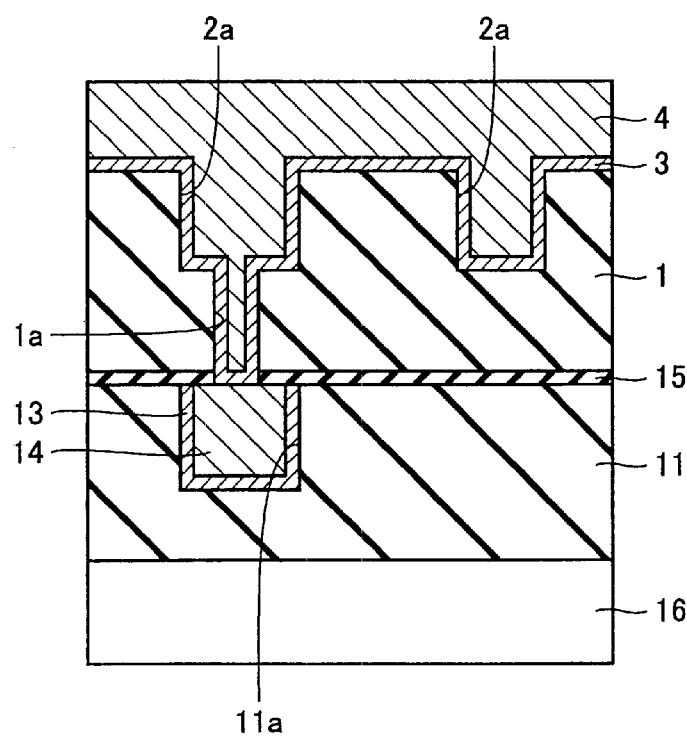

Referring to FIG. 19, a barrier metal 3 made of a TaN film and a Cu film 4 are formed in the same manner as the first embodiment, and these are then abraded and removed by the CMP method, thereby forming upper-layer interconnections 3, 4 as shown in FIG. 14. The above-mentioned processes are repeated so that multi-layer interconnection is formed.

Figure 32:
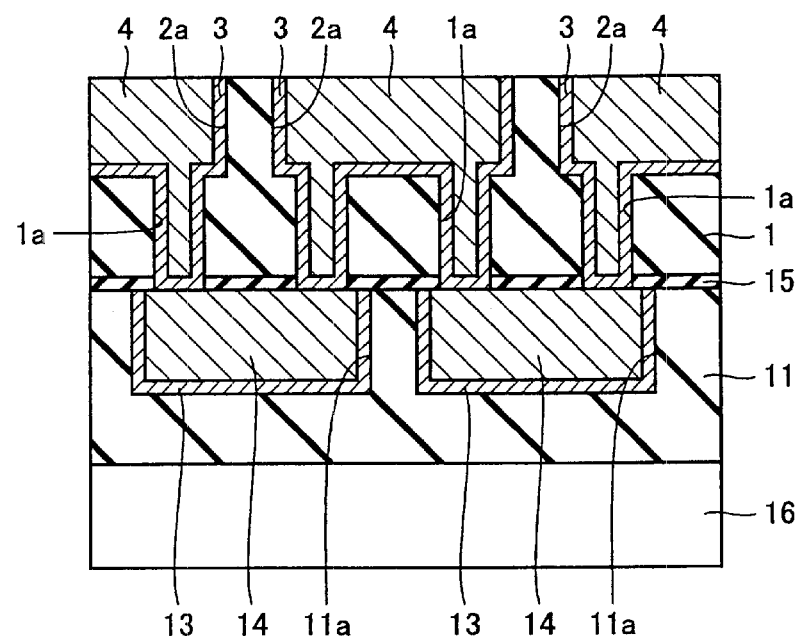
FIG. 32 is schematic cross-sectional views that show a structure of via hole chains manufactured by the method of the fifth embodiment.

By using the method as described above, via hole chains as shown in FIG. 32 were formed. For reference purposes, a via hole chain as shown in FIG. 7B was formed by a conventional method in the same manner. The number of via holes of the via hole chain was set to 3000, and the via diameter was set to 0.4 $\mu$m. Table 6 shows the yield and dispersion of resistance.

TABLE 6

Yield and dispersion of resistance of via hole chain

|  | Yield | Dispersion of resistance |
| --- | --- | --- |
| Present Embodiment | 100% | 8% |
| Conventional Example | 87% | 14% |

The results show that the manufacturing method of the present embodiment is superior to the conventional example both in the yield and dispersion of resistance (standard deviation/average value).

Moreover, in comparison with the first to fourth embodiments, since the present embodiment requires the coating process only once, it is advantageous in terms of costs.

(Sixth Embodiment)

The first to fifth embodiments have exemplified cases in which the groove 2a and the connection hole 1a are formed in respectively separate exposing processes; however, these may be formed in the same exposing process. The following description will discuss the sixth embodiment in which the simultaneous exposing process is carried out.

Since the structure of the semiconductor device in accordance with the present embodiment is virtually the same as the structures of the second embodiment explained by reference to FIG. 1, the description thereof is omitted.

Next, an explanation will be given of the manufacturing method of the present embodiment.

Referring to FIG. 2, a semiconductor substrate or a lower-layer interlayer film 16, an interlayer insulating film 11 and lower-layer interconnections 13, 14 are formed in the same manner as the first embodiment. A stopper layer 15 is formed on the lower-layer interconnections 13, 14 by, for example, a plasma CVD method. Photosensitive insulating films 1 and 2 are successively formed on the stopper layer 15 by coating, and this is then pre-baked. Each of the photosensitive insulating films 1 and 2 is formed by, for example, PS-MSZ, with a thickness of, for example, 1 µm. Here, the sensitivity of the photosensitive insulating film 1 is set to be lower than the sensitivity of the photosensitive insulating film 2. The sensitivity of the photosensitive insulating layer is controlled by changing the amount of the photosensitive agent in the insulating film, as described in the second embodiment.

Referring to FIG. 4, a pattern of a connection hole 1a and a pattern of a groove 2a are simultaneously exposed. This exposure is carried out by an electron beam, and in the groove 2a portion, only the photosensitive insulating film 2 is exposed by reducing the dose of exposure, while in the hole 1a portion, both of the photosensitive insulating films 1 and 2 are exposed by increasing the dose of exposure. A data setting is carried out by inputting image-forming data of the electron beam and respective data of the hole 1a and groove 2a so as to make the dose of exposure greater at the connection hole 1a portion; thus, it becomes possible to expose the connection hole 1a and groove 2a through the exposing process performed only once.

Referring to FIG. 5, the stopper layer 15 exposed from the connecting hole 1a is removed by dry etching. Thus, one portion of the surface of the lower-layer interconnections 13, 14 is exposed.

Referring to FIG. 6, a barrier metal 3 made of a TaN film and a Cu film 4 are formed in the same manner as the first embodiment, and these are then abraded and removed by the CMP method, thereby forming upper-layer interconnections 3, 4 as shown in FIG. 1. The above-mentioned processes are repeated so that multi-layer interconnection is formed.

By using the method as described above, via hole chains as shown in FIG. 7A were formed. For reference purposes, a via hole chain as shown in FIG. 7B was formed by a conventional method in the same manner. The number of via holes of the via hole chain was set to 3000, and the via diameter was set to 0.4 µm. Table 7 shows the yield and dispersion of resistance.

TABLE 7

Yield and dispersion of resistance of via hole chain

|  | Yield | Dispersion of resistance |
| --- | --- | --- |
| Present Embodiment | 100% | 3% |
| Conventional Example | 87% | 14% |

The results show that the manufacturing method of the present embodiment is superior to the conventional example both in the yield and dispersion of resistance (standard deviation/average value).

Moreover, in comparison with the first to fifth embodiments, since the present invention requires the transferring process only once, it is advantageous in terms of costs.

Figure 21:
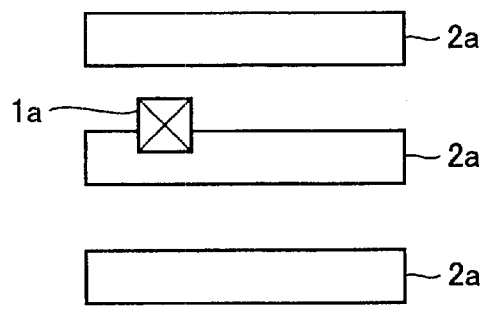
FIG. 21 is a plan view that explains the fact that the structure of the conventional semiconductor device requires an alignment margin.

Moreover, as illustrated in FIG. 21, in the conventional method, upon transferring the connection hole 1a, the pattern of the connection hole 1a needs to be aligned with respect to the pattern of the groove 2a, with the result that a margin has to be placed between the intervals of the grooves 2a by taking into consideration alignment errors.

In contrast, in the method of the present embodiment, since the patterns of the connection hole 1a and the groove 2a are simultaneously transferred, it is not necessary to provide the alignment process for the pattern of the groove 2a upon transferring the pattern of the connection hole 1a. Therefore, as illustrated in FIG. 22, no alignment margin is required, thereby making it possible to reduce the interconnection intervals.

Figure 22:
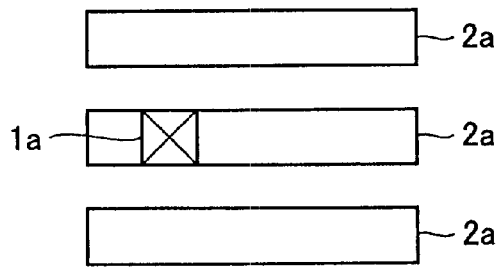
FIG. 22 is a plan view that explains the fact the structure of the semiconductor device of a sixth embodiment of the present invention eliminates the necessity of the alignment margin.
Figure 23:
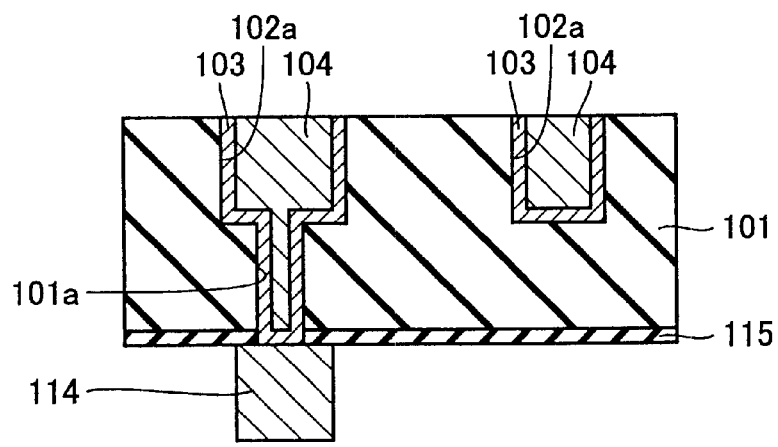
FIG. 23 is a schematic cross-sectional view that shows the structure of a conventional semiconductor device.
Figure 24:
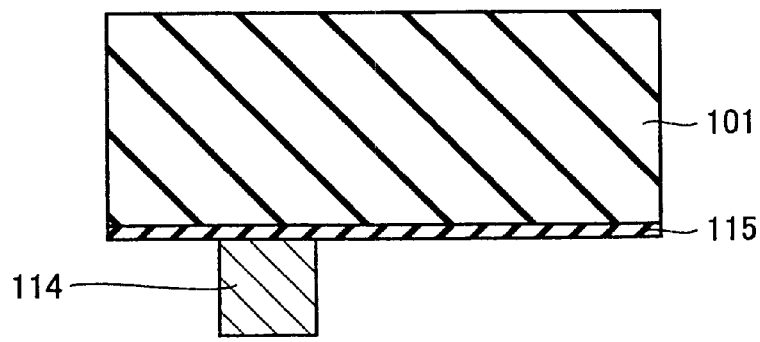
FIGS. 24 through 30 are schematic cross-sectional views that show a sequence of processes of a manufacturing method of the conventional semiconductor device.
Figure 25:
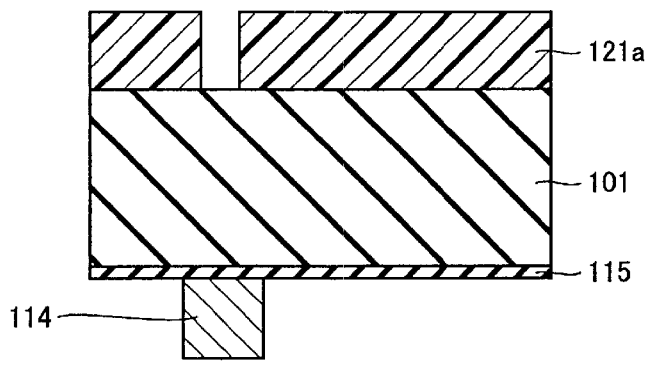
Figure 26:
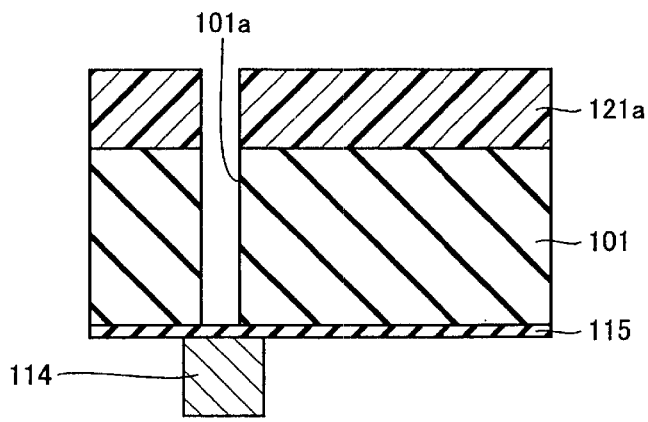
Figure 27:
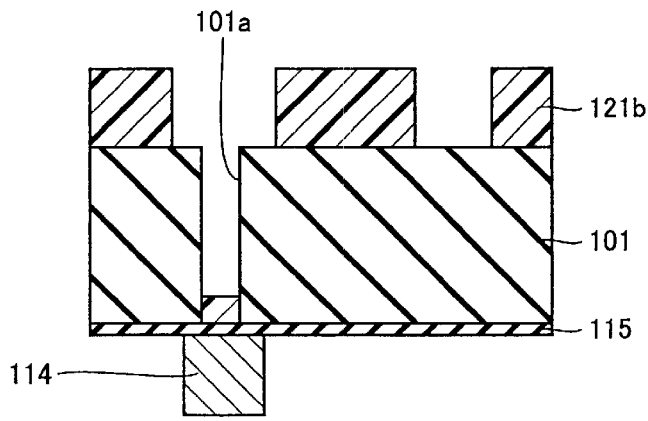
Figure 28:
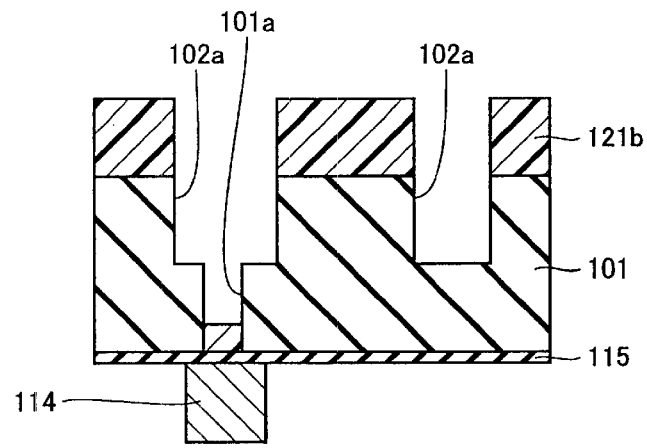
Figure 29:
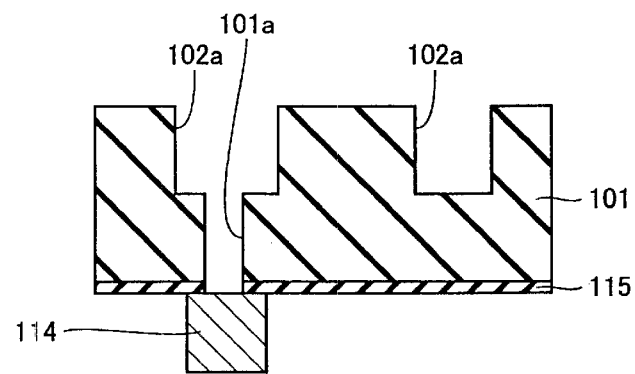
Figure 30:
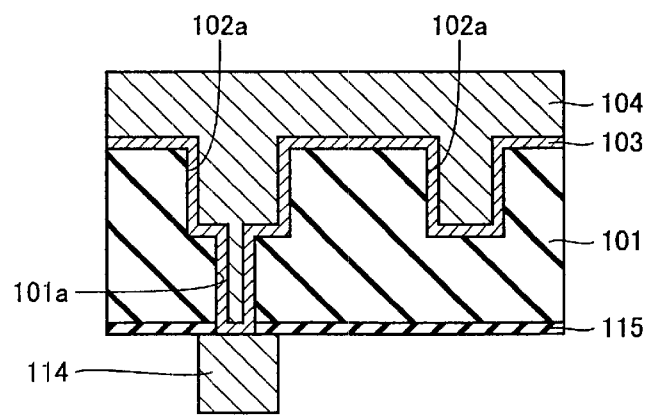

Here, in the structure as shown in FIG. 22, since the exposure of the groove 2a and the exposure of the connection hole 1a are simultaneously carried out, the connection hole 1a is formed so as to be positioned only within an area below the groove 2a. Moreover, the width of the groove 2a and the aperture width of the connection hole 1a are virtually the same so that the side wall of the groove 2a and the side wall of the connection hole 1a constitute a virtually continuous surface.

Here, the present embodiment has exemplified a case in which the photosensitive insulating films 1 and 2 having mutually different sensitivities are laminated; however, as described in the fifth embodiment, the photosensitive insulating film having a single layer may be used.

Moreover, with respect to the material for the photosensitive insulating film constituted by a single layer or not less than two layers in the first to sixth embodiments, materials listed in the following Table may be adopted.

TABLE 8

| Trade name | Manufacturer | Light source |
| --- | --- | --- |
| Probelec-8071 | Vantico | i rays |
| XP9500CC | Shipley | i rays |
| V259PA(SAMPLE) | Shinnittetsu Chemical | i rays |
| SU-08 | Mac Demid | i rays, EB |
| PHOTONEATH | Toray | i rays |
| PL-H708,2708,2720,2731 HD-4000,6000,8000,5100 | Hitachi Chemical du Pont Microsystem | i rays |
| BCB | Dow Chemical | g, i rays |
| PS-MSZ | Clariant Japan | i rays, KrF, FB |
| OEBR1000(PGMA) | Tokyo Applied Chemical | EB |
| COP | Chisso | EB |
| SAL-601,-605 | Shipley | EB |
| RE-4210N | Hitachi Chemical | EB |
| OEBR1000(PMMA) | Tokyo Applied Chemical | EB |
| PBS | Chisso | EB |

TABLE 8-continued

| Trade name | Manufacturer | Light source |
|---|---|---|
| RE5000P,5100P,5221P | Hitachi Chemical | EB |
| EBR-9,-900 | Toray | EB |
| SEPR | Shinetsu Chemical | EB |

Moreover, the first to sixth embodiments have exemplified cases in which a single layer or two layers of photosensitive insulating films are interpolated between the lower-layer interconnections 13, 14 and the upper-layer interconnections 3, 4; however, not less than three layers of photosensitive insulating films may be interpolated.

Furthermore, in the first to sixth embodiments, the interlayer insulating film 11 is shown as a single layer; however, the interlayer insulating film 11 may have a structure to be interpolated between the lower-layer interconnections 13, 14 and the upper-layer interconnections 3, 4 in the first to sixth embodiments. In other words, the interlayer insulating film 11 may have a photosensitive property, or may be constituted by a single layer or not less than two layers of photosensitive insulating films, or may have a structure in which an absorbing film is interpolated between not less than two layers of photosensitive insulating films.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a multi-layer interconnection structure including:
   a substrate;
   an interlayer insulating film on the substrate;
   a lower-layer interconnection in said interlayer insulating film;
   an upper-layer interconnection; and
   an insulating film between said interlayer insulating film and said upper-layer interconnection, said insulating film comprising a photosensitive film including a groove filled with said upper-layer interconnection at an upper surface of said insulating film and a connection hole filled with an electrically conducting material connecting said upper-layer interconnection to said lower-layer interconnection, wherein said insulating film includes a lower-layer insulating film and an upper-layer insulating film that are photosensitive to mutually different wavelengths and are laminated, said connection hole is in said lower-layer insulating film, and said groove is in said upper-layer insulating film.

2. The semiconductor device according to claims 2, wherein a wavelength to which said lower-layer insulating film is photosensitive is shorter than a wavelength to which said upper-layer insulating film is photosensitive.

3. A semiconductor device comprising a multi-layer interconnection structure including:
   a substrate;
   an interlayer insulating film on the substrate;
   a lower-layer interconnection in said interlayer insulating film;
   an upper-layer interconnection; and
   an insulating film between said interlayer insulating film and said upper-layer interconnection, said insulating film comprising a photosensitive film including a groove filled with said upper-layer interconnection at an upper surface of said insulating film and a connection hole filled with an electrically conducting material connecting said upper-layer interconnection to said lower-layer interconnection, wherein said insulating film includes a lower-layer insulating film and an upper-layer insulating film that have mutually different photosensitivities and are laminated, said connection hole is in said lower-layer insulating film, and said groove is in said upper-layer insulating film.

4. The semiconductor device according to claim 3, wherein the photosensitivity of said lower-layer insulating film is lower than the photosensitivity of said upper-layer insulating film.

5. The semiconductor device according to claim 4, wherein said connection hole is located only within an area opposite said groove.

6. The semiconductor device according to claim 5, wherein said groove has a groove width and said connection hole has an aperture width essentially identical to the groove width, and said groove and said connection hole have respective side walls forming an essentially continuous surface.

7. A semiconductor device comprising a multi-layer interconnection structure including:
   a substrate;
   an interlayer insulating film on the substrate;
   a lower-layer interconnection in said interlayer insulating film;
   an upper-layer interconnection; and
   an insulating film between said interlayer insulating film and said upper-layer interconnection, said insulating film comprising a photosensitive film including a groove filled with said upper-layer interconnection at an upper surface of said insulating film and a connection hole filled with an electrically conducting material connecting said upper-layer interconnection to said lower-layer interconnection, wherein said insulating film includes a lower-layer insulating film and an upper-layer insulating film that are photosensitive to mutually different exposure sources and are laminated, said connection hole is in said lower-layer insulating film, and said groove is in said upper-layer insulating film.

8. The semiconductor device according to claim 3, wherein said lower-layer insulating film is responsive to two kinds of exposure sources, and said upper-layer insulating film is responsive to one of the two kinds of exposure sources.

9. A semiconductor device comprising a multi-layer interconnection structure including:
   a substrate;
   an interlayer insulating film on the substrate;
   a lower-layer interconnection in said interlayer insulating film;
   an upper-layer interconnection; and
   an insulating film between said interlayer insulating film and said upper-layer interconnection, said insulating film comprising a photosensitive film including a groove filled with said upper-layer interconnection at an upper surface of said insulating film and a connection hole filled with an electrically conducting material connecting said upper-layer interconnection to said lower-layer interconnection, wherein said insulating film includes a first photosensitive insulating film, an exposure source absorption film, and a second photosensitive insulating film that are laminated in succession, said connection hole is in said first photosensitive insulating film, and said groove is on said second photosensitive insulating film.

10. A semiconductor device comprising a multi-layer interconnection structure including:

a substrate;

an interlayer insulating film on the substrate;

a lower-layer interconnection in said interlayer insulating film;

an upper-layer interconnection; and a single photosensitive insulating film supported on said interlayer insulating film and including
a groove filled with said upper-layer interconnection at an upper surface of said insulating film, and
a connection hole extending from the groove to said lower-layer interconnection and filled with an electrically conducting material connecting said upper-layer interconnection to said lower-layer interconnection.

* * * * *